(12) United States Patent
Liu

(10) Patent No.: US 8,315,062 B2
(45) Date of Patent: Nov. 20, 2012

(54) ELECTRONIC DEVICE AND FIXING MECHANISM

(75) Inventor: Zhi-Hua Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 200 days.

(21) Appl. No.: 12/815,212

(22) Filed: Jun. 14, 2010

(65) Prior Publication Data

US 2011/0134616 A1 Jun. 9, 2011

(30) Foreign Application Priority Data

Dec. 8, 2009 (CN) .......................... 2009 1 0311077

(51) Int. Cl.
*H05K 5/00* (2006.01)
(52) U.S. Cl. ................. 361/759; 361/807; 361/810
(58) Field of Classification Search ............. 361/759, 361/807, 810, 728–730, 752, 796, 800, 809; 174/138 E, 138 G
See application file for complete search history.

(56) References Cited

U.S. PATENT DOCUMENTS

| | | | | |
|---|---|---|---|---|
| 4,546,408 | A | * | 10/1985 | Rodseth et al. ............... 361/720 |
| 5,516,089 | A | * | 5/1996 | Seniff et al. .................... 269/304 |
| 5,519,169 | A | * | 5/1996 | Garrett et al. ................. 174/371 |
| 5,671,124 | A | * | 9/1997 | Ho ................................. 361/758 |
| 6,347,044 | B1 | * | 2/2002 | Won et al. ..................... 361/807 |
| 6,560,119 | B1 | * | 5/2003 | Katsuyama et al. .......... 361/752 |
| 6,741,460 | B2 | * | 5/2004 | Huang .................... 361/679.58 |
| 6,813,161 | B2 | * | 11/2004 | Le et al. ......................... 361/758 |
| 2011/0067208 | A1 | * | 3/2011 | Liu ............................. 24/594.11 |

* cited by examiner

*Primary Examiner* — Hung S Bui
(74) *Attorney, Agent, or Firm* — Altis Law Group, Inc.

(57) ABSTRACT

A electronic device includes a housing, a PCB, and a fixing mechanism. The PCB defines a mounting hole. The fixing mechanism includes a connecting member, a latch piece, and a screw. The connecting member is fixed to the housing, and it includes a contact portion contact the PCB and defines a cavity adjacent to the contact portion. The contact portion defines a positioning hole communicating with the cavity. The latch piece is slidably received in the cavity and defines a threaded hole. The screw has a diameter smaller than a width of the positioning hole and extends through the mounting hole and the positioning hole and engages in the threaded hole to fix the PCB to the housing.

16 Claims, 5 Drawing Sheets

US 8,315,062 B2

ELECTRONIC DEVICE AND FIXING MECHANISM

BACKGROUND

1. Technical Field

The present disclosure relates generally to electronic devices, particularly, to an electronic device having a fixing mechanism.

2. Description of Related Art

Electronic devices usually include a housing and a printed circuit board (PCB) received in the housing. To ensure the stability and reliability of the electronic devices, various fixing mechanisms have been applied to fix the PCB to the housing.

A typical fixing mechanism include a fixing pillar located on the housing defining a threaded hole, and a screw extending through the PCB and fixedly received in the threaded hole of the fixing pillar. However, sometimes the fixing pillar is not exactly perpendicular to the PCB, and the screw may be prone to press or scratch a surface of the PCB during assembly.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
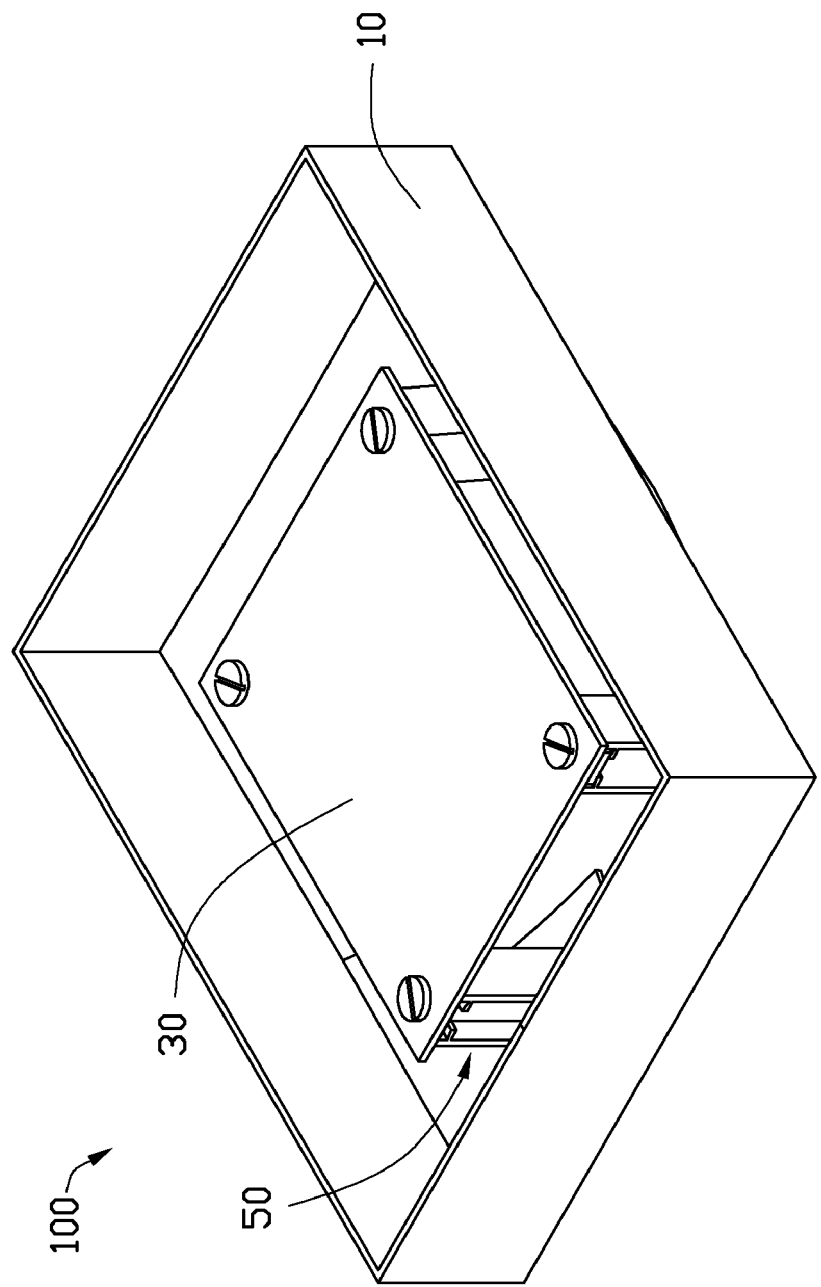
FIG. 1 is an isometric view of an embodiment of a part of an electronic device.
Figure 2:
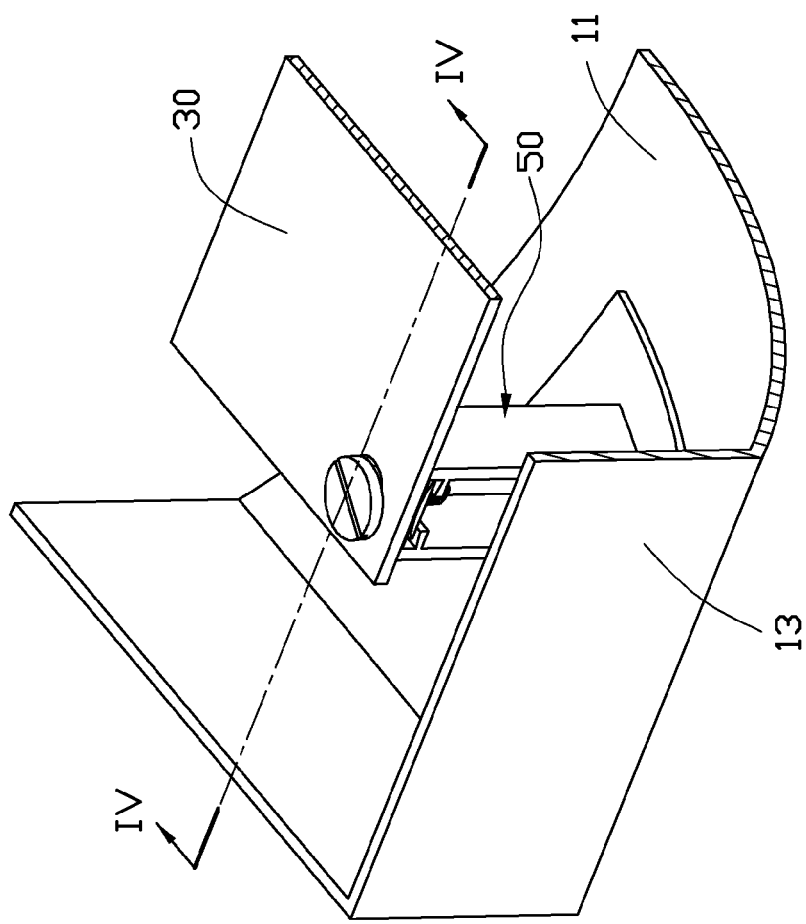
FIG. 2 is a partial, enlarged, isometric view of the electronic device of FIG. 1, the electronic device including a fixing mechanism.

Referring to FIGS. 1 and 2, an embodiment of an electronic device 100 includes a housing 10, a printed circuit board (PCB) 30, and four fixing mechanisms 50. The electronic device 100 can be a mobile phone, personal digital assistant (PDA), display devices, and so on. In one embodiment, the electronic device 100 is a display device for a personal computer, which includes various modules to perform corresponding functions and features, however, for simplicity, in the following embodiment only one of the fixing mechanisms 50 for the PCB 20 is described.

The housing 10 includes a substantially curved bottom surface 11, and four side surfaces 13 extending from a periphery of the bottom surface 11. The PCB 30 is substantially rectangular and is fixed to the bottom surface 11 by four fixing mechanisms 50 positioned adjacent to four corners of the PCB 30.

Figure 3:
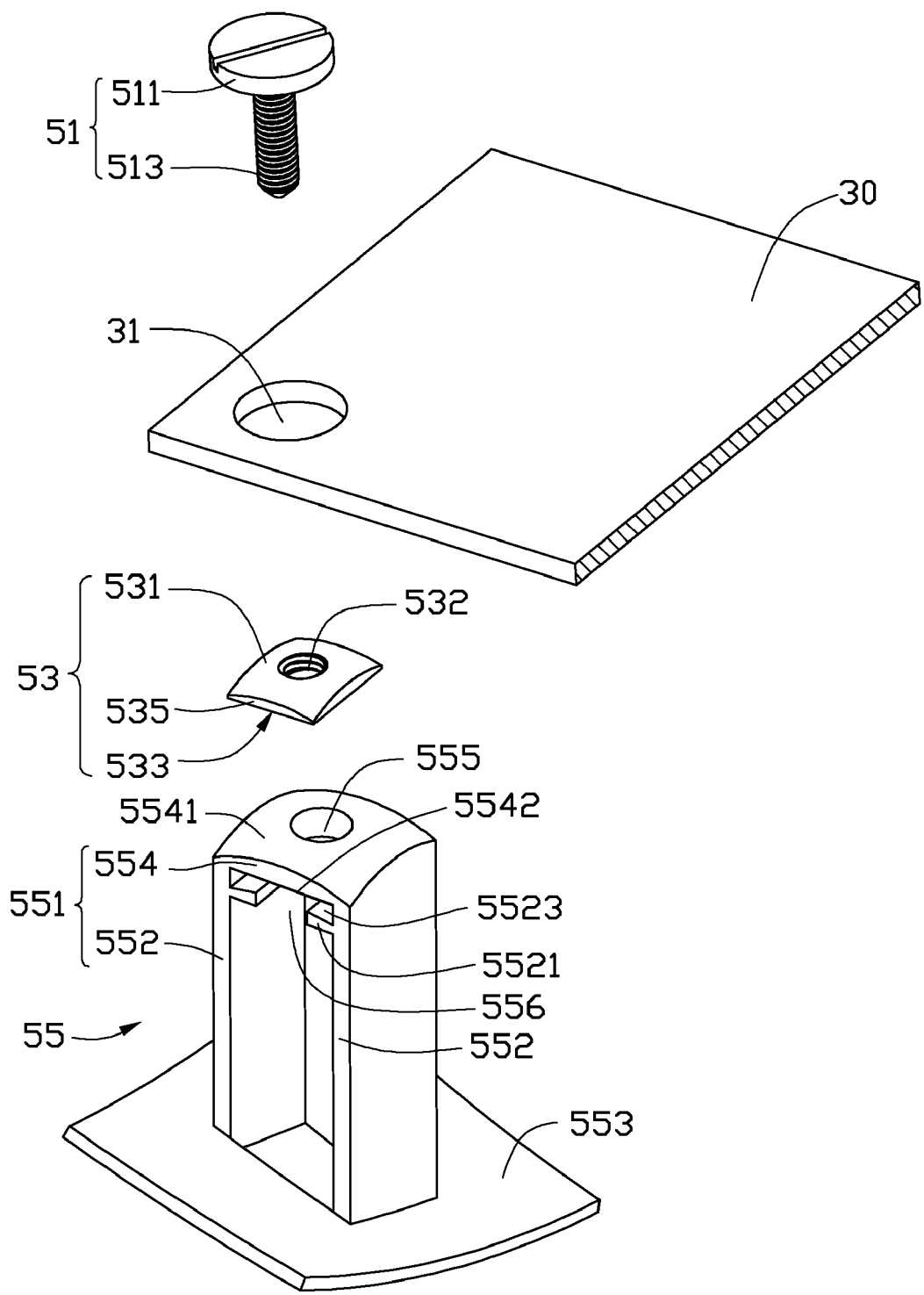
FIG. 3 is an exploded, isometric view of the fixing mechanism of FIG. 2.

Referring to FIG. 3, the PCB 30 defines a substantially circular mounting hole 31 adjacent to each corner. The fixing mechanism 50 includes a screw 51, a latch piece 53, and a connecting member 55.

The screw 51 includes a head portion 511 and a threaded portion 513 extending from a side of the head portion 511. A diameter of the head portion 511 exceeds that of the mounting hole 31, and a diameter of the threaded portion 513 is less than that of the mounting hole 31.

The latch piece 53 includes a top surface 531, a bottom surface 533, and four side surfaces 535 interconnecting the top surface 531 and the bottom surface 533. The top surface 531 is substantially spherical in shape. The bottom surface 533 is substantially planar and is shaped as a substantially regular polygon. In one embodiment, the bottom surface 533 is substantially square. The latch piece 53 defines a threaded hole 532 in a middle portion to receive the threaded portion 513 of the screw 51.

The connecting member 55 includes a main body 551 and a fixing portion 553 connected to the main body 551. The fixing portion 553 is a plate having a substantially curved surface (not labeled) attached to the bottom surface 11 of the housing 10 by, for example, gluing or welding.

The main body 551 includes two substantially parallel support plates 552 extending from a side of the fixing portion 553, and a contact portion 554 interconnecting two ends of the support plates 552. The main body 551 further includes two convex ribs 5521 respectively extending from facing side surfaces of the two support plates 552. Each convex rib 5521 includes a substantially arcuate support surface 5523 opposite to the contact portion 554. The contact portion 554 includes a first contact surface 5541 configured to contact the PCB 30, and a second contact surface 5542 opposite to the first contact surface 5541 configured to contact the top surface 531 of the latch piece 53. The first contact surface 5541 is substantially spherical, and the second contact surface 5542 is substantially planar. The two support surfaces 5523, the two side surfaces of the two support plates 552, and the second contact surface 5542 cooperatively define a substantially rectangular cavity 556 to receive the latch piece 53.

The width of the cavity 556, which is a vertical distance between the two support plates 552 in one embodiment, exceeds the width of the bottom surface 533, which is a vertical distance between opposite side surfaces 535 of the latch piece 53 in one embodiment. In addition, supposing a circle circumscribes the square shaped bottom surface 533, the width of the cavity 556 is less than a diameter of that circle, which is a length of a diagonal of the bottom surface 533 in one embodiment. Accordingly, the latch piece 53 is capable of sliding along support surfaces 5523 inside the cavity 556, while rotation of the latch piece 53 inside the cavity 556 is restricted to a maximum rotation angle of 360° around an axis of the threaded hole 532. The contact portion 554 defines a substantially circular positioning hole 555 in the first contact surface 5541 communicating with the cavity 556. A diameter of the positioning hole 555 is less than that of the mounting hole 31 of the PCB 30, but exceeds that of the threaded portion 513 of the screw 51.

Figure 4:
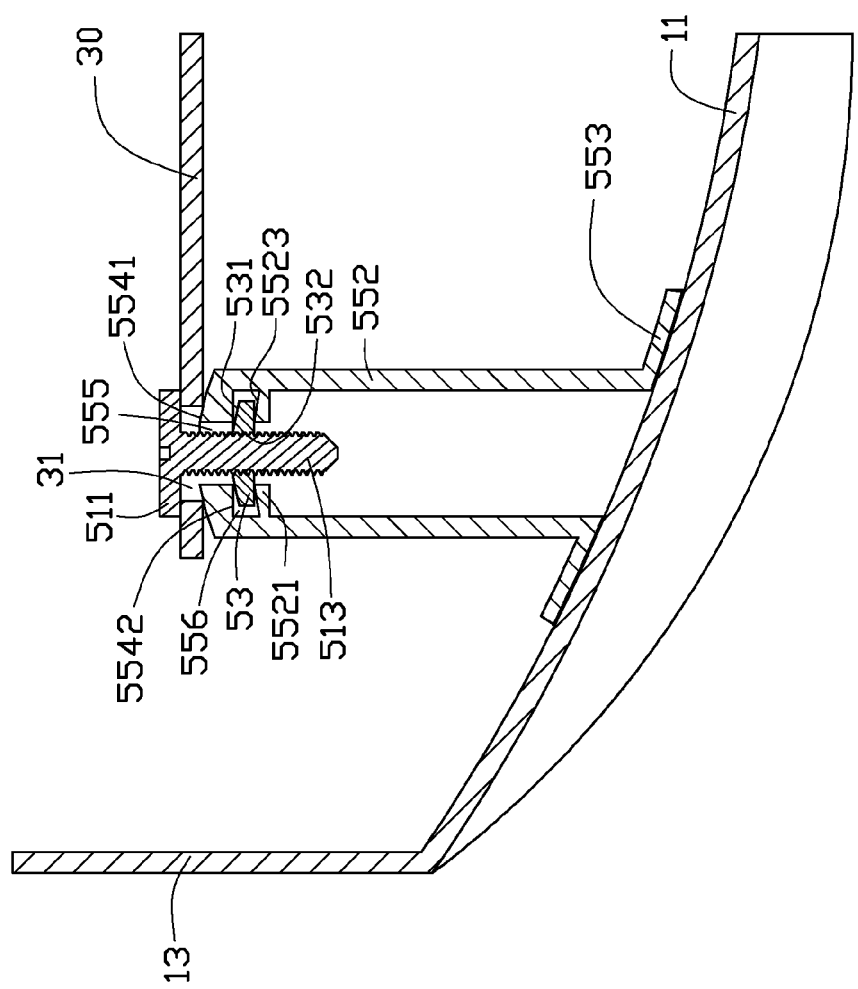
FIG. 4 is a cross-section of the fixing mechanism in FIG. 3 taken along line IV-IV.

Referring to FIG. 4, in assembly, the fixing portion 553 of the connecting member 55 is attached to the bottom surface 11 of housing 10. The latch piece 53 is located inside the cavity 556, and the threaded hole 532 is aligned with the positioning hole 555. The PCB 30 is placed on the connecting member 55, and the mounting hole 31 is aligned with the positioning hole 555. The threaded portion 513 of the screw 51 extends through the mounting hole 31, the positioning hole 555, and engages in the threaded hole 532, such that the PCB 30 is fixed to the housing 10. During assembly, the latch piece 53 may rotate a few degrees along with the screw 51 and stop when two opposite corners of the latch piece 53 contact with the two side surfaces of the two support plates 552, because the vertical distance between the two support plates 552 is less than the length of the diagonal of the bottom surface 533. When assembly is completed, the first contact surface 5541 contacts a bottom surface of the PCB 30 on a portion around the mounting hole 31. Because the first contact surface 5541 is substantially spherical, the shape of a contact surface between the first contact surface 5541 and the bottom surface of the PCB 30 is substantially circular, such that the PCB 30 is subjected to a relatively uniform force by the connecting member 55 and therefore less likely be damaged or deformed. Likewise, the substantially spherical top surface 531 of the latch piece 53 resists the second contact surface 5542 on a portion around the positioning hole 555, such that the latch piece 53 is also subjected to a relatively uniform force by the connecting member 55 and less likely to be damaged or deformed.

Figure 5:
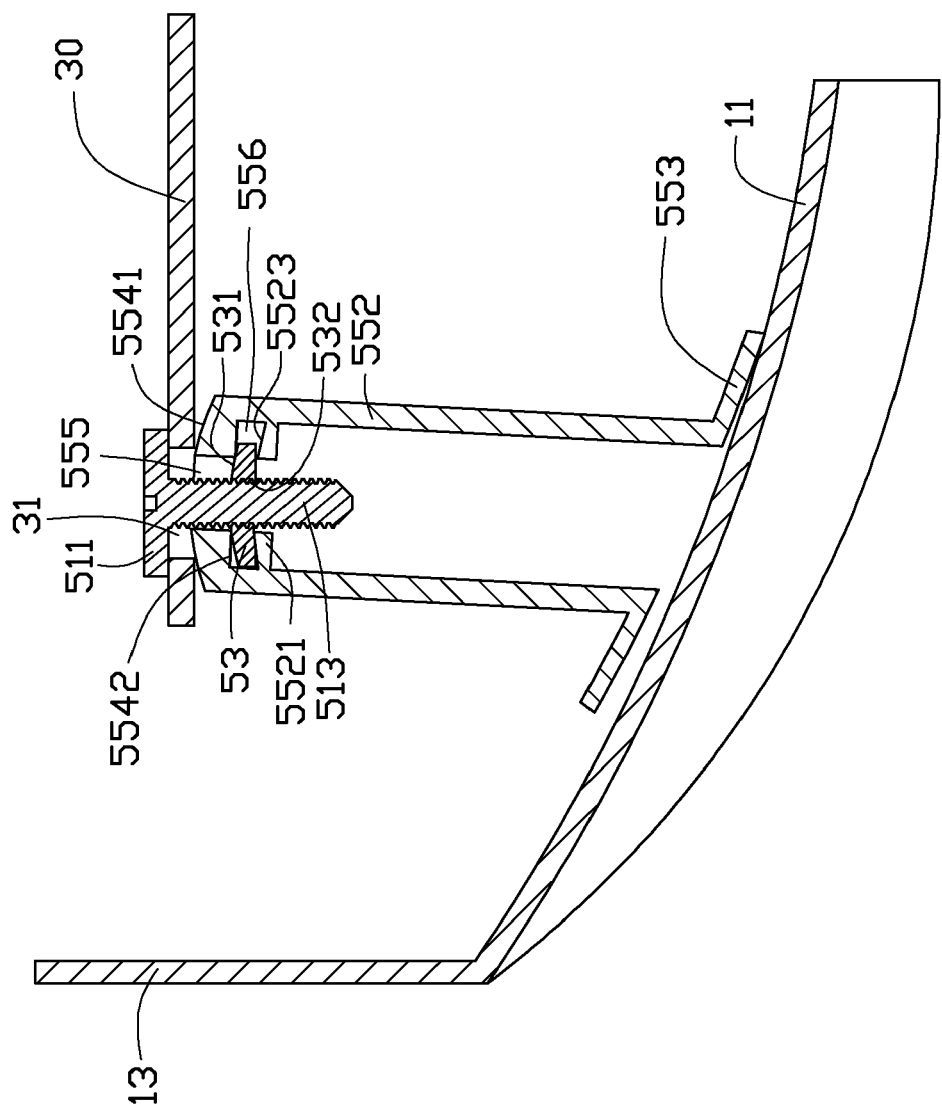
FIG. 5 is similar to FIG. 4, but shows a different state of the fixing mechanism.

Referring to FIG. 5, during assembly, to prevent problems arising from the fixing portion 553 of the connecting member 55 not being fully attached to the bottom surface 11 of housing 10 due to some error, and the main body 551 not being perfectly perpendicular to the PCB 30, the latch piece 53 can slide along support surfaces 5523 inside the cavity 556, such that the threaded hole 532 is coaxially aligned with the mounting hole 31. Accordingly, the threaded portion 513 of the screw 51 can still extend perpendicular to the PCB 30 through the threaded hole 532 to fix the PCB 30 to the housing 10. When the assembly is completed, the head portion 511 of the screw 51 fully contacts the top surface of the PCB 30 and applies a relatively uniform force to the PCB 30, such that the PCB 30 is not likely to be damaged or deformed.

It is to be understood that, the bottom surface 533 of the latch piece 53 may be shaped as other regular polygons, such as a regular triangle, a regular pentagon, or irregular polygons, such as an isosceles triangle, a trapezoid, or the like.

The shape of the top surface 531 and the first contact surface 5541 is not limited to be spherical, it may be, for example, some other type of curved surface. The convex ribs 5521 may be omitted.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device, comprising:
    a housing;
    a printed circuit board (PCB) defining a mounting hole;
    a fixing mechanism comprising:
        a connecting member fixed to the housing, the connecting member comprising a contact portion contacting the PCB and defining a cavity adjacent to the contact portion, the contact portion defining a positioning hole communicating with the cavity;
        a latch piece slidably and rotatably received in the cavity, the latch piece defining a threaded hole aligned with the positioning hole; wherein, a rotation of the latch piece inside the cavity is restricted to a maximum rotation angle of 360 degrees around an axis of the threaded hole; wherein the latch piece comprises a bottom surface which is planar and shaped as a substantially regular polygon, the cavity is substantially rectangular, the width of the cavity exceeds the minimal width of the bottom surface and is less than a diameter of a circle circumscribing the bottom surface; and
        a screw having a diameter smaller than a width of the positioning hole;
    wherein the crew extends through the mounting hole and the positioning hole and engages in the threaded hole, to fix PCB to the housing.

2. The electronic device of claim 1, wherein the connecting member comprises a main body and a fixing portion fixed to the housing and connected to the main body; and the contact portion is located at an end of the main body.

3. The electronic device of claim 2, wherein the main body comprises two support plates, that are separated from each other, connected to the fixing portion, and the contact portion interconnects two ends of the two support plates; the main body further comprises two convex ribs located on two facing side surfaces of the two support plates; and the cavity is cooperatively defined by the two convex ribs, the two support plates, and the contact portion; a vertical distance between the two support plates exceeds a width of the latch piece but less than a length of a diagonal of the latch piece.

4. The electronic device of claim 3, wherein each of the two convex ribs comprises a support surface, that is substantially arcuate, opposite to the contact portion, and the latch piece is capable of sliding on the support surfaces.

5. The electronic device of claim 1, wherein the contact portion comprises a first contact surface that is substantially spherical.

6. The electronic device of claim 5, wherein the contact portion comprises a second contact surface, that is substantially planar, opposite to the first contact surface.

7. The electronic device of claim 6, wherein the latch piece comprises a top surface, that is substantially spherical, to contact the second contact surface.

8. The electronic device of claim 1, wherein a width of the positioning hole is less than a width of the mounting hole.

9. A fixing mechanism comprising:
    a connecting member comprising a contact portion and defining a cavity adjacent to the contact portion, the contact portion defining a positioning hole communicating with the cavity;
    a latch piece slidably and rotatably received in the cavity, the latch piece defining a threaded hole aligned with the positioning hole; wherein a rotation of the latch piece inside the cavity is restricted to a maximum rotation angle of 360 degrees around an axis of the threaded hole; and wherein the latch piece comprises a bottom surface which is planar and shaped as a substantially regular polygon, the cavity is substantially rectangular, the width of the cavity exceeds the minimal width of the bottom surface and is less than a diameter of a circle circumscribing the bottom surface.

10. The fixing mechanism of claim 9, wherein the connecting member comprises a main body and a fixing portion connected to the main body; and the contact portion is located at an end of the main body.

11. The fixing mechanism of claim 10, wherein the main body comprises two support plates, that are separated from each other, connected to the fixing portion, and the contact portion interconnects two ends of the two support plates; the main body further comprises two convex ribs located on two facing side surfaces of the two support plates; and the cavity is cooperatively defined by the two convex ribs, the two support plates, and the contact portion; a vertical distance between the two support plates exceeds a width of the latch piece but less than a length of a diagonal of the latch piece.

12. The fixing mechanism of claim 11, wherein each of the two convex ribs comprises a support surface, that is substantially actuate, opposite to the contact portion, and the latch piece is capable of sliding on the support surfaces.

13. The fixing mechanism of claim 9, wherein the contact portion comprises a first contact surface that is substantially spherical.

14. The fixing mechanism of claim 13, wherein the contact portion comprises a second contact surface, that is substantially planar, opposite to the first contact surface.

15. The fixing mechanism of claim 14, wherein the latch piece comprises a top surface, that is substantially spherical, to contact the second contact surface.

16. An electronic device, comprising:
- a housing;
- a printed circuit board (PCB) defining a mounting hole;
- a fixing mechanism comprising:
    - a connecting member fixed to the housing, the connecting member comprising two substantially parallel support plates and a contact portion interconnecting two ends of the support plates; the contact portion contacting the PCB and defining a cavity adjacent to the contact portion, and further defining a positioning hole communicating with the cavity;
    - a latch piece slidably and rotatably received in the cavity, the latch piece defining a threaded hole aligned with the positioning hole; and
    - a screw having a diameter smaller than a width of the positioning hole; wherein the screw extends through the mounting hole and the positioning hole and engages in the threaded hole, to fix PCB to the housing;
- wherein, the connecting member further comprises two convex ribs located on two facing side surfaces of the two support plates, and the cavity is cooperatively defined by the two convex ribs, the two support plates, and the contact portion; a vertical distance between the two support plates exceeds a width of the latch piece but less than a length of a diagonal of the latch piece, such that, a rotation of the latch piece inside the cavity is restricted to a maximum rotation angle of 360° around an axis of the threaded hole.

* * * * *